(12) United States Patent
Chua

(10) Patent No.: US 7,423,296 B2
(45) Date of Patent: Sep. 9, 2008

(54) APPARATUS FOR PRODUCING A SPECTRALLY-SHIFTED LIGHT OUTPUT FROM A LIGHT EMITTING DEVICE UTILIZING THIN-FILM LUMINESCENT LAYERS

(75) Inventor: Bee Yin Janet Chua, Penang (MY)

(73) Assignee: Avago Technologies ECBU IP Pte Ltd, Singapore (SG)

( * ) Notice: Subject to any disclaimer, the term of this patent is extended or adjusted under 35 U.S.C. 154(b) by 774 days.

(21) Appl. No.: 10/375,874

(22) Filed: Feb. 26, 2003

(65) Prior Publication Data

US 2004/0173806 A1 Sep. 9, 2004

(51) Int. Cl.
*H01L 33/00* (2006.01)
(52) U.S. Cl. .................. 257/98; 257/100; 257/E33.061
(58) Field of Classification Search ........... 257/98–100, 257/79, 80, 89, 97, 82, 103, E33.061; 296/81; 313/501, 502, 503, 512
See application file for complete search history.

(56) References Cited

U.S. PATENT DOCUMENTS

| | | | | |
|---|---|---|---|---|
| 3,649,328 A * | 3/1972 | Neis | ............................ | 427/72 |
| 6,066,861 A | 5/2000 | Hohn et al. | | |
| 6,576,488 B2 | 6/2003 | Collins, III et al. | | |
| 6,576,933 B2 | 6/2003 | Sugaware et al. | | |
| 6,642,913 B1 * | 11/2003 | Kimura et al. | ................. | 345/84 |
| 6,650,044 B1 * | 11/2003 | Lowery | ....................... | 313/502 |
| 6,696,703 B2 * | 2/2004 | Mueller-Mach et al. | ....... | 257/98 |
| 6,838,816 B2 * | 1/2005 | Su et al. | ....................... | 313/499 |
| 6,924,514 B2 * | 8/2005 | Suenaga | ....................... | 257/98 |
| 7,019,335 B2 * | 3/2006 | Suenaga | ....................... | 257/99 |
| 7,126,162 B2 * | 10/2006 | Reeh et al. | ..................... | 257/98 |
| 7,129,638 B2 * | 10/2006 | Ng | ............................. | 313/512 |
| 2004/0169181 A1 * | 9/2004 | Yoo | ............................ | 257/81 |
| 2007/0120135 A1 * | 5/2007 | Soules et al. | .................. | 257/98 |

FOREIGN PATENT DOCUMENTS

| | | |
|---|---|---|
| DE | 196 38 667 A1 | 4/1998 |
| EP | 1 132 977 A2 | 9/2001 |
| EP | 1 267 424 A2 | 12/2002 |

OTHER PUBLICATIONS

German Office Action dated Apr. 28, 2005 involving German counterpart application No. 103 58 348.3-33.
English translation of German Office Action dated Apr. 28, 2005 involving German counterpart application No. 103 58 348.3-33.

* cited by examiner

*Primary Examiner*—Minh-Loan T Tran

(57) ABSTRACT

A lighting device provides a spectrally-shifted light output from a light source. The lighting device includes a semiconductor light emitting device providing a source light and a first thin-film luminescent material layer coating a surface of the semiconductor light emitting device. The first thin-film luminescent material layer includes a luminescent material that emits an emitted light in response to the source light. The first thin-film luminescent material layer has a specific and consistent thickness and specific and consistent density of luminescent particles. The emitted light includes a first luminescent material emitted light when the luminescent material completely absorbs the source light. The emitted light includes a first composite light when the first luminescent material absorbs less than all of the source light. The device may further include a second thin-film luminescent layer coating the first thin-film luminescent layer.

17 Claims, 4 Drawing Sheets

APPARATUS FOR PRODUCING A SPECTRALLY-SHIFTED LIGHT OUTPUT FROM A LIGHT EMITTING DEVICE UTILIZING THIN-FILM LUMINESCENT LAYERS

FIELD OF THE INVENTION

The technical field of this disclosure is light emitting diodes (LEDs), particularly, spectrally-shifted light output from LEDs.

BACKGROUND OF THE INVENTION

Light emitting diodes (LEDs) are increasingly used as a light source for lighting applications, such as, for example in conjunction with through-hole package assemblies. Various methods are used to produce white light from light emitting diodes.

One conventional method produces a white light using three different types of light emitting diodes (LEDs). This method generates the basic colors of red, green and blue to produce the white light. Unfortunately, when diffused light from R (red), G (green), and B (blue) LEDs is mixed to produce white light, several issues arise. These issues include variation of output color due to different utilized LEDs, complex drive circuits due to the different drive voltages needed by each different type LED, as well as different rates of deterioration under operating conditions.

Another method uses a blue light emitting device (LED) to illuminate a cerium-activated yttrium aluminum garnet ($Y_3Al_5O_{12}:Ce^{3+}$) phosphor material. In this method, the LED emits blue light that excites the phosphor. The phosphor is capable of absorbing at least a portion of the blue light and emitting a longer wavelength, i.e. broadband yellow light. The human eye perceives the combination of the blue light produced from the LED and the yellow light produced by the phosphor emission as white light. FIG. 1 shows an existing lighting device, such as a reflector cup 100, currently in use within the industry. In FIG. 1, reflector cup mounting package 100 includes a light source 110, shown here as a single LED located within reflector cup 120. Light source 110 provides uniform illumination throughout cavity 130 to surface 140.

In order to alter light output from reflector cup mounting package 100, it is a common industry practice to place a mixture 150 within cavity 130. The mixture 150 may include one or more phosphor compounds, such as the cerium activated yttrium aluminum garnet described above, with an optically-clear substance, for example optically-clear epoxy. The mixing results in the phosphor compound becoming suspended in the optically clear substance. When the suspended phosphor compound absorbs light from light source 110, the phosphor compound emits light based on an interaction of the absorbed light and the phosphor compounds.

Despite widespread industry use of the above-described device, this and other similar types of lighting devices have a number of disadvantages. One such disadvantage is a result of the process of mixing phosphor compounds with an optically-clear substance. It is difficult to achieve and duplicate a uniform mixture of the phosphor compound particles in the optically-clear substance. This difficulty results in a less than desirable uniformity of the light emission from the lighting device.

It would be desirable, therefore, to provide a method and device that would overcome this and other disadvantages.

SUMMARY OF THE INVENTION

One aspect of the invention provides a lighting device that includes a semiconductor light emitting device providing a source light. The lighting device further includes a first thin-film luminescent material layer coating a surface of the semiconductor light emitting device and including a luminescent material emitting an emitted light in response to the source light. The first thin-film luminescent material layer has a specific and consistent thickness and a specific and consistent density of luminescent particles.

In accordance with another aspect of the invention, a process for fabricating a lighting apparatus includes providing a semiconductor light emitting device operable to provide a source light. The process further includes providing a first luminescent material. The process additionally includes coating a surface of the semiconductor light emitting device with a thin layer of first luminescent material having a specific and consistent thickness and a specific and consistent density of luminescent particles.

In accordance with yet another aspect of the invention, the invention includes a method for providing a spectrally-shifted light output by providing a semiconductor light emitting device having a first thin-film luminescent material layer coating a surface of the light emitting device. The first thin-film luminescent material layer has a specific and consistent thickness and a specific and consistent density of luminescent particles. A source light is generated using the semiconductor light emitting device. At least part of the source light is generated within the first thin-film luminescent material layer. A first emitted light is emitted from the first thin-film luminescent material layer in response to the absorbed source light.

The foregoing and other features and advantages of the invention will become further apparent from the following detailed description of the presently preferred embodiment, read in conjunction with the accompanying drawings. The detailed description and drawings are merely illustrative of the invention rather than limiting, the scope of the invention being defined by the appended claims and equivalents thereof.

DETAILED DESCRIPTION OF PRESENTLY PREFERRED EMBODIMENTS

Throughout the specification, and in the claims, the term "connected" means a direct electrical connection between the things that are connected, without any intermediate devices. The term "coupled" means either a direct electrical or optical connection between the things that are connected, or an indirect connection through one or more passive or active intermediary devices. The term "light" is defined as covering the entire spectrum including, but not limited to, infrared and ultraviolet.

Illustrative Lighting Device

Figure 1:
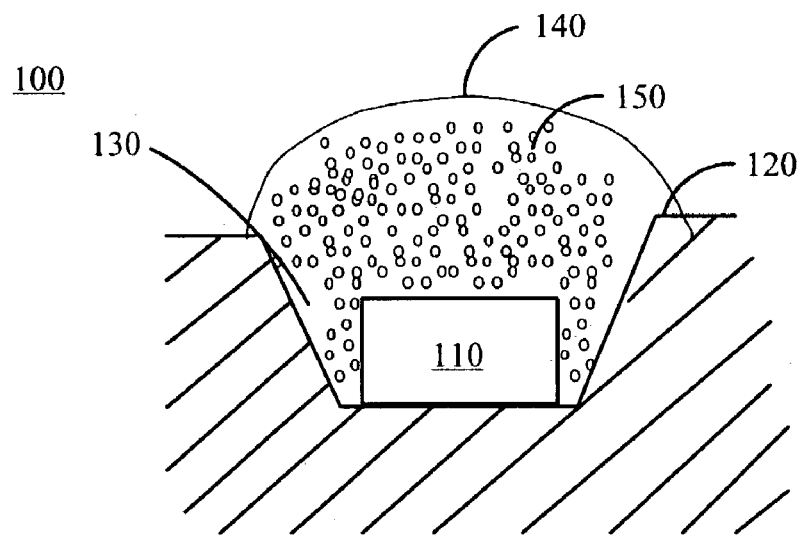
FIG. 1 is a schematic diagram illustrating a conventional lighting device.
Figure 2:
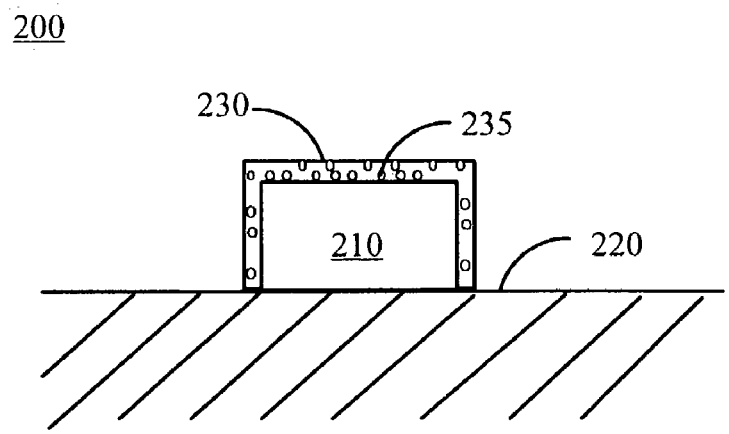
FIG. 2 is a schematic diagram illustrating a lighting device according to a first embodiment of the present invention.

Referring to FIG. 2, a lighting device for producing a spectrally-shifted light output, according to a first embodiment of the present invention, is generally shown at numeral 200. Lighting device 200 includes a semiconductor light emitting device 210, mounting surface 220, and a thin-film luminescent material layer 230.

In one embodiment, lighting device 200 is mounted in a surface mount package. In this embodiment, mounting surface 220 is a surface of the surface mount package. In other embodiments, lighting device 200 can be mounted in a reflector cup mounting package (not shown) or in a through-hole package (not shown). In such embodiments, mounting surface 220 is a surface of a reflector cup mounting package or a surface of a through-hole package, respectively.

In one embodiment, semiconductor light emitting device 210 is implemented as a light emitting diode (LED). In an example, semiconductor light emitting device 210 is implemented as an (UV) ultra violet light emitting diode. In another embodiment, semiconductor light emitting device 210 is implemented as laser diode. In an example, semiconductor light emitting device 210 is implemented as an ultra violet (UV) laser diode. Suitable providers of LEDs and laser diodes include, for example: CREE INC. of Durham, N.C.; Epistar Corp. of Hsinchu, Taiwan, ROC; and Arima Optoelectronics Corp. of Dashi Taoyuan, Taiwan, ROC.

In FIG. 2, thin-film luminescent material layer 230 is implemented as a coating on the surface of semiconductor light emitting device 210. Thin-film luminescent material layer 230 includes luminescent particles 235 suspended therein.

Luminescent material including the luminescent particles 235 is deposited onto the exposed surface of semiconductor light emitting device 210. The luminescent material is deposited by, for example, spraying, rolling, dipping, printing, fluidization, or electrophoretic deposition. Such deposition methods cause thin-film luminescent material layer 230 to have a specific and consistent thickness and a specific and consistent density of luminescent particles.

In an example, a specific and consistent thickness of the luminescent material is deposited onto the exposed surface of semiconductor light emitting device 210 to form thin-film luminescent material layer 230 by the fluidization technique described in U.S. patent application Ser. No. 10/375,321, filed Feb. 26, 2003.

In yet another example, a specific and consistent thickness of the luminescent material is deposited onto the exposed surface of semiconductor light emitting device 210 to form thin-film luminescent material layer 230 by the electrophoretic deposition method described in U.S. Pat. No. 6,864,110, issued Mar. 8, 2005.

In one embodiment, a layer of luminescent material having a specific and consistent thickness and density of luminescent particles is deposited onto the exposed surface of a fabricated light emitting or laser diode to form thin-film luminescent material layer 230. In another embodiment, a layer of luminescent material having a specific and consistent thickness and density of luminescent particles is deposited onto the exposed surface of a wafer of light emitting or laser diodes during processing to form thin-film luminescent material layer 230. In an example, a layer of luminescent material having a specific and consistent thickness and density of luminescent particles is deposited onto the exposed surface of the wafer after the light emitting or laser diodes are fabricated, but prior to separation of the wafer into individual light emitting devices or laser diodes.

In operation, source light emitted from semiconductor light emitting device 210 is absorbed by the luminescent particles 235 within the thin-film luminescent material layer 230. In response to the absorbed source light, the luminescent particles photoluminesce and emit a luminescent material emitted light.

In one embodiment, the source light is completely absorbed by thin-film luminescent material layer 230 and only the luminescent material emitted light is emitted from lighting device 200. In another embodiment, thin-film luminescent material layer 230 absorbs less than all of the source light. In this embodiment, lighting device 200 emits a composite light including unabsorbed source light and the luminescent material emitted light is emitted.

In the present invention, any number of LED and luminescent material combinations can be used to provide the luminescent material emitted light or composite light. By utilizing a thin-film luminescent material layer having a specific and consistent thickness and a specific and consistent density of luminescent particles on the surface of the LED, a consistent color of emitted light can be obtained. In one embodiment, the luminescent material is implemented as a phosphor material or a blend of two or more phosphor materials, such as, for example a phosphor compound.

In an example, when white light is desired, a blue LED with peak emission wavelength of 450-480 nm can be used as the semiconductor light emitting device 210 The luminescent particles 235 within thin-film luminescent material layer 230 can be a cerium-activated yttrium aluminum garnet phosphor ($Y_3Al_5O_{12}$:$Ce^{3+}$). In this example, thin-film luminescent material layer 230 having a thickness of approximately 30 micrometers (μm) results in a composite light having a "white" appearance. A thinner application (~25 μm) will result in the composite light having a "bluish white" appearance while a thicker application (~35 μm) will result in the composite light having a "yellowish white" appearance.

In another example in which the luminescent particles 235 within thin-film luminescent material layer 230 are cerium activated yttrium aluminum garnet phosphor ($Y_3Al_5O_{12}$:$Ce^{3+}$), the thin-film luminescent material layer 230 having a thickness of approximately 15 μm results in a composite light having a "blue" appearance. A thinner application (~10 μm) will result in the composite light having a "deep blue" appearance while a thicker application (~20 μm) will result in the composite light having a "bluish white" appearance.

In yet another example in which the luminescent particles 235 within thin-film luminescent material layer 230 are cerium activated yttrium aluminum garnet phosphor ($Y_3Al_5O_{12}$:$Ce^{3+}$), the thin-film luminescent material layer 230 having a thickness of approximately 50-55 μm results in a composite light having a "yellow" appearance. A thinner application (~45 μm) will result in the composite light having a "light yellow" appearance while a thicker application (~60 μm) will result in the composite light having a "deep yellow" appearance.

In yet another embodiment, the luminescent material emitted light may be the only light desired to be emitted by lighting device 200. In this embodiment, the luminescent particles 235 within thin-film luminescent material layer 230 absorb all of the source light. Consequently, lighting device 200 emits only light generated by the luminescent particles 235 within luminescent material layer 230. In an example, a lighting device that incorporates an LED that emits ultraviolet (UV) light would use such a luminescent material layer if it were desired that the lighting device not emit UV radiation. In this example, semiconductor light emitting device 210 is implemented as ultra-violet (UV) light emitting diode (LED), an ultra-violet (UV) laser diode, and other similar light emitting devices.

Figure 3:
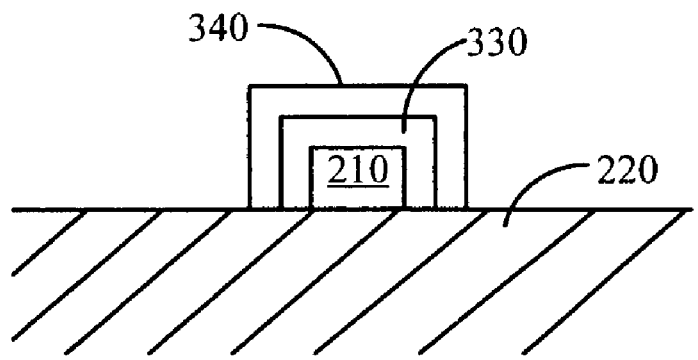
FIG. 3 is a schematic diagram illustrating a lighting device according to a second embodiment of the present invention.

FIG. 3 is a schematic diagram illustrating a lighting device according to a second embodiment of the present invention. Lighting device 300 includes a semiconductor light emitting device 210, mounting surface 220, a first thin-film luminescent material layer 330, and a second thin-film luminescent material layer 340. Each thin-film luminescent material layer (330, 340) includes luminescent particles (not shown). Like components from FIG. 2 are labeled and function similarly.

In one embodiment, lighting device 300 is mounted on a surface mount package. In this embodiment, mounting surface 220 is a surface of the surface mount package as shown in FIG. 3. In other embodiments, lighting device 300 is mounted in a reflector cup mounting package (not shown) or in a through-hole package (not shown). In such embodiments, mounting surface 220 is a surface of a reflector cup mounting package or a surface of a through-hole package, respectively.

In FIG. 3, first thin-film luminescent material layer 330 is implemented as a coating on the exposed surface of semiconductor light emitting device 210. Luminescent material including the luminescent particles is deposited onto the exposed surface of semiconductor light emitting device 210. The luminescent material is deposited by, for example, spraying, rolling, dipping, printing, fluidization, or electrophoretic deposition. Such deposition methods cause first thin-film luminescent material layer 330 to have a specific and consistent thickness and density of luminescent particles.

In this embodiment, second thin-film luminescent material layer 340 is implemented as a coating overlying first thin-film luminescent material layer 330. Luminescent material including the luminescent particles is deposited onto the exposed surface of first thin-film luminescent material layer 330. The luminescent material is deposited by, for example, spraying, rolling, dipping, printing, fluidization, or electrophoretic deposition. Such deposition methods cause second thin-film luminescent material layer 340 to have a specific and consistent thickness and density of luminescent particles.

In operation, source light emitted from semiconductor light emitting device 210 is absorbed, at least in part, by the luminescent particles of first thin-film luminescent material layer 330. In one embodiment, the source light is completely absorbed by first thin-film luminescent material layer 330 and an emitted light including a first luminescent material emitted light is solely emitted from first thin-film luminescent material layer 330.

In another embodiment, thin-film luminescent material layer 330 absorbs less than all of the source light. In this embodiment, an emitted light including a composite light containing unabsorbed source light and the first luminescent material emitted light is emitted.

The emitted light passes to the second thin-film luminescent material layer 340. The emitted light is absorbed, at least in part, by the second thin-film luminescent material layer 340. The second thin-film luminescent material layer 340 then emits a second composite light.

In the present invention, any number of LED and luminescent material combinations can be used so long as the luminescent material of first thin-film luminescent material layer 330 absorbs at least part of the source light and the luminescent material of second thin-film luminescent material layer 340 absorbs part of the emitted light and the source light. The source light from LED 210 and first thin-film luminescent material layer 330 generate the first luminescent material emitted light or the composite light and, in response thereto, the second thin-film luminescent material layer 340 generates the second composite light by photoluminescence.

By using a first thin-film luminescent material layer having a specific and consistent thickness and a specific and consistent density of luminescent particles deposited on the exposed surface of LED 210 and a second thin-film luminescent material layer having a specific and consistent thickness and a specific and consistent density of luminescent particles deposited overlying first thin-film luminescent material layer 330, the lighting device generates a consistent color.

In one embodiment, the luminescent material within each thin-film luminescent material layer is implemented as a phosphor material or a blend of one or more phosphor materials, such as, for example a phosphor compound. In an example and referring to FIG. 3, when white light is desired, a blue LED with peak wavelength of 450-480 nm can be used as the semiconductor light emitting device 210.

In this example, the luminescent particles within first thin-film luminescent material layer 330 can be a red phosphor, such as, for example a europium-activated calcium sulphide phosphor ($CaS:Eu^{2+}$) or a europium-activated strontium sulphide phosphor ($SrS:Eu^{2+}$). YVO4:Eu3+,Bi3+ The luminescent particles within second thin-film luminescent material layer 340 can be a green phosphor, such as, for example a (Sr,Ca,Ba)(Al,Ga)2S4:Eu2+; BaMgAl10O17:Eu2+,Mn2+

In this example, a first thin-film luminescent material layer 330 having a thickness of between 5-6.5 µm and a second thin-film luminescent material layer 340 having a thickness of between 3.3-5 µm results in a second composite light having a "white" appearance.

In another example, the luminescent particles within first thin-film luminescent material layer 330 can be a green phosphor, such as one of the phosphor compounds listed in the preceding paragraphs. The luminescent particles within second thin-film luminescent material layer 340 can be a red phosphor, such as one of the phosphor compounds listed in the preceding paragraphs. In this example, a first thin-film luminescent material layer 330 having a thickness of between 3.3-5 µm and a second thin-film luminescent material layer 340 having a thickness of between 5-6.5 µm results in a composite light having a "white" appearance.

Figure 4:
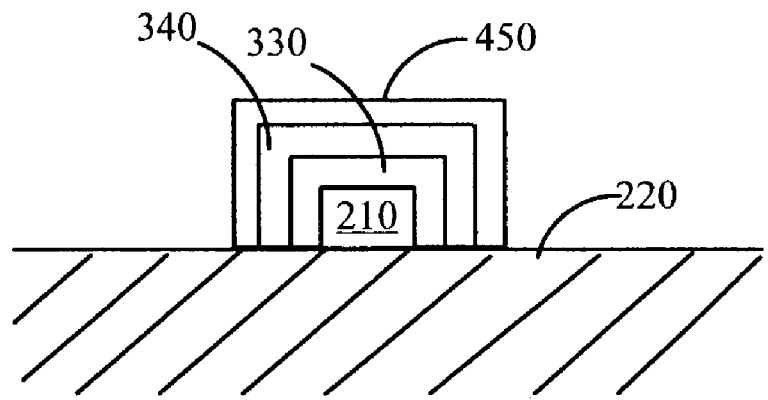
FIG. 4 is a schematic diagram illustrating a lighting device according to a third embodiment of the present invention.

FIG. 4 is a schematic diagram illustrating a lighting device according to a third embodiment of the present invention. Lighting device 400 includes a semiconductor light emitting device 210, mounting surface 220, a first thin-film luminescent material layer 330, a second thin-film luminescent material layer 340, and a third thin-film luminescent material layer 450. Each thin-film luminescent material layer (330, 340, and 450) includes luminescent particles (not shown). Like components from FIGS. 2 and 3 are labeled and function similarly.

In one embodiment, lighting device 400 is mounted in a surface mount package. In this embodiment, mounting surface 220 is a surface of the surface mount package as shown in FIG. 4. In other embodiments, lighting device 400 can be mounted in a reflector cup mounting package (not shown) or in a through-hole package (not shown). In such embodiments, mounting surface 220 is a surface of a reflector cup mounting package or a surface of a through-hole package, respectively.

In FIG. 4, third thin-film luminescent material layer 450 is implemented as a coating overlying second thin-film luminescent material layer 340. Luminescent material including the luminescent particles is deposited onto the exposed surface of second thin-film luminescent material layer 340. The luminescent material is deposited by, for example, spraying, rolling, dipping, printing, fluidization, or electrophoretic deposition. Such deposition methods cause third thin-film luminescent material layer 450 to have a specific and consistent thickness and a specific and consistent density of luminescent particles.

A specific and consistent thickness of the third thin-film luminescent material layer 450 is deposited onto the exposed surface of second thin-film luminescent material layer 340 such as, for example by spraying, rolling, dipping, printing, or fluidizing methodology.

In operation, part of the second composite light emitted from the second thin-film luminescent material layer 340 is absorbed by the luminescent particles of the third thin-film luminescent material layer 450 and third thin-film luminescent material layer 450 emits light as a third composite light. Third composite light includes all light emitted from the light source and may have as many as 4 components. The third light source may be an ultraviolet LED (UV-LED). Ultraviolet light is used to convert the phosphor layers, namely the red, green and blue layers, to emit white light. The red and green phosphor may comprise the substances described earlier, and the blue phosphor may be BaMg2Al16O27:Eu.

Illustrative Fabrication Process

Figure 5:
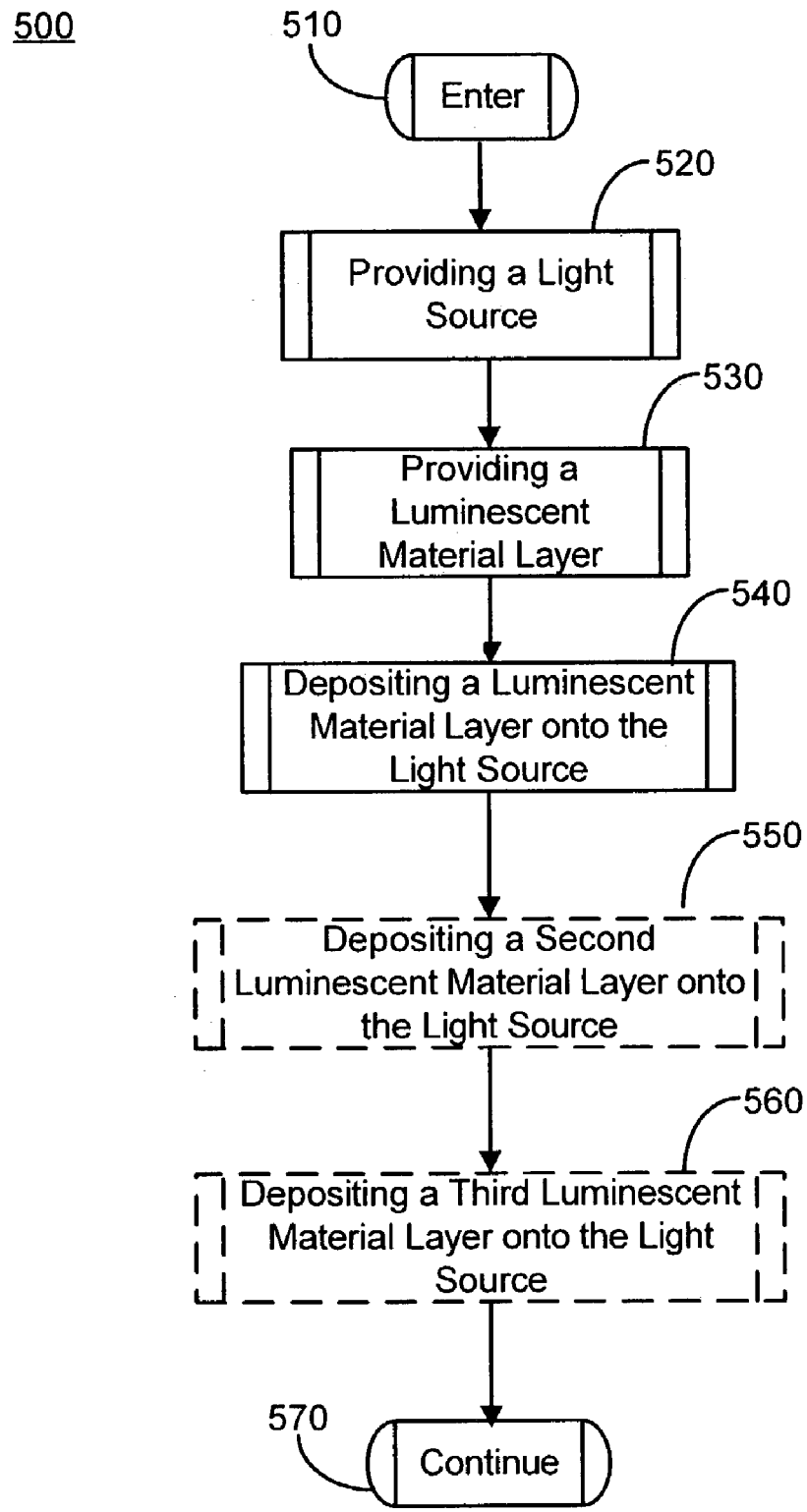
FIG. 5 is a flow diagram depicting an exemplary process in accordance with the present invention.

FIG. 5 is a flow diagram depicting an exemplary process in accordance with the present invention. FIG. 5 details an embodiment of a process 500 for fabricating a lighting device that provides a spectrally-shifted output. Process 500 may be used to make one or more of the devices described or referenced in FIGS. 2-4, above.

Process 500 begins at block 510. At block 520, a light source is provided. In an embodiment, a semiconductor light emitting device is provided mounted in a surface mountable package. In other embodiments, a semiconductor light emitting device is provided mounted in a reflector cup package or mounted in a through-hole package. In one example, semiconductor light emitting device 210 of FIGS. 2-4 is provided.

At block 530, a luminescent material is provided. In one embodiment, the luminescent material provided is a phosphor material or a blend of two or more phosphor materials, such as a compound phosphor. In an example, the luminescent material is implemented as luminescent particles within a suitable liquid carrier.

At block 540, luminescent material is deposited onto an exposed surface of the light source forming a thin-film luminescent material layer. In one embodiment, luminescent material including luminescent particles is deposited onto the exposed surface of the semiconductor light emitting device. The luminescent material is deposited by, for example, spraying, rolling, dipping, printing, fluidization, or electrophoretic deposition. Such deposition methods cause the thin-film luminescent material layer to have a specific and consistent thickness and a specific and consistent density of luminescent particles.

In an example and referring to FIG. 2 above, thin-film luminescent material layer 230 is implemented as a coating on the exposed surface of semiconductor light emitting device 210. In this example, luminescent material is deposited onto an exposed surface of light emitting device 210 utilizing a spraying methodology, such as a time pressure dispensing system, an industrial spraying machine, or an ink spray marking machine.

At optional block 550, luminescent material is deposited onto the exposed surface of the thin-film luminescent material layer forming a second thin-film luminescent material layer. In one embodiment, the luminescent material including luminescent particles is deposited by, for example, spraying, rolling, dipping, printing, fluidization, or electrophoretic deposition. Such deposition methods cause the second thin-film luminescent material layer to have a specific and consistent thickness and a specific and consistent density of luminescent particles.

In an example and referring to FIG. 3 above, thin-film luminescent material layer 330 is implemented as a coating on the exposed surface of semiconductor light emitting device 210 and second thin-film luminescent material layer 340 is implemented as a coating overlying thin-film luminescent material layer 330.

At optional block 560, luminescent material is deposited onto the exposed surface of the second thin-film luminescent material layer forming a third thin-film luminescent material layer. In one embodiment, the luminescent material including luminescent particles is deposited by, for example, spraying, rolling, dipping, printing, fluidization, or electrophoretic deposition. Such deposition methods cause the third thin-film luminescent material layer to have a specific and consistent thickness and a specific and consistent density of luminescent particles.

In an example and referring to FIG. 4 above, thin-film luminescent material layer 330 is implemented as a coating on the exposed surface of semiconductor light emitting device 210, second thin-film luminescent material layer 340 is implemented as a coating overlying thin-film luminescent material layer 330, and third thin-film luminescent material layer 450 is implemented as a coating overlying second thin-film luminescent material layer 340.

Process 500 then advances to block 570 where it ends.

Illustrative Method of Generating Light

Figure 6:
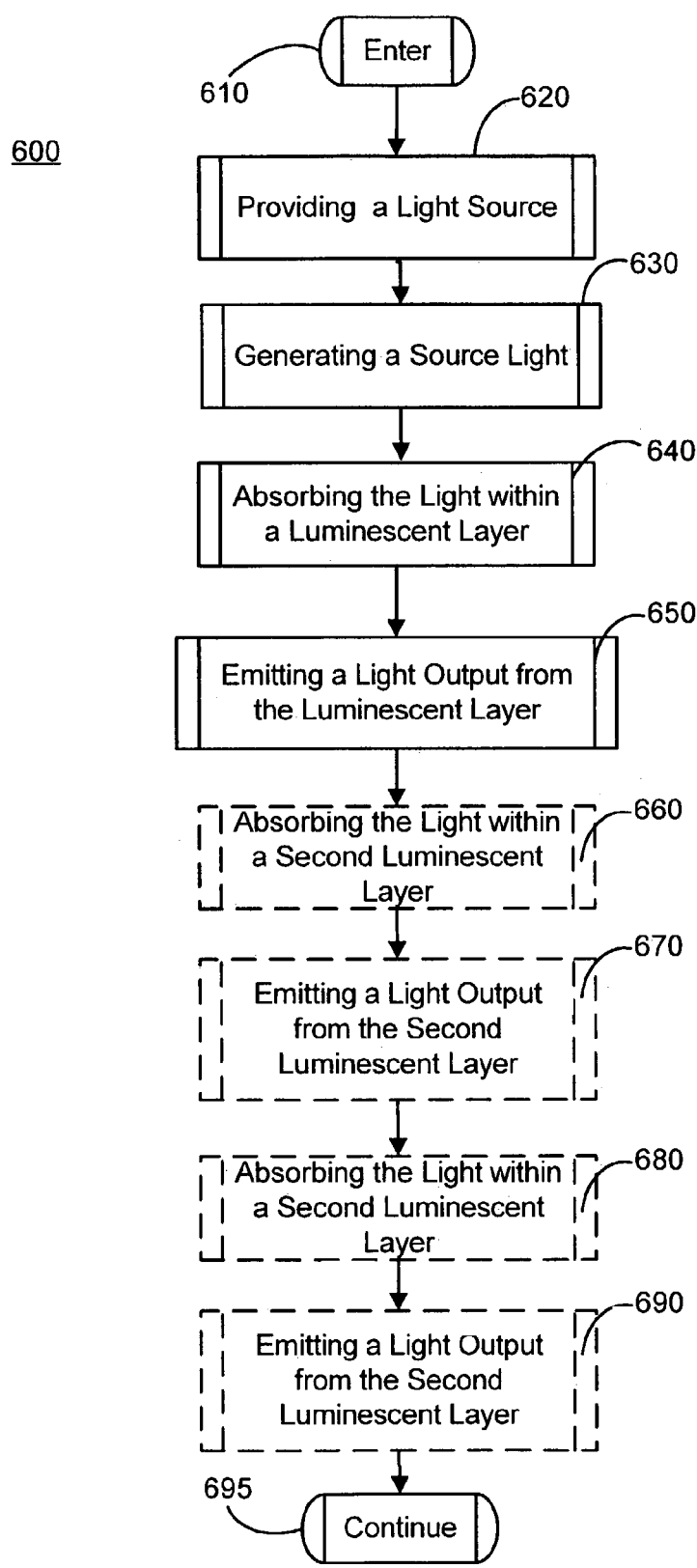
FIG. 6 is a flow diagram depicting an exemplary method in accordance with the present invention.

FIG. 6 is a flow chart showing an embodiment of a method 600 for producing a spectrally-shifted light output. Method 600 may be performed using one or more of the devices described above or referenced in FIGS. 2-4, above. Method 600 begins at block 610.

At block 620, a light source is provided. In one embodiment, the light source is implemented as a semiconductor light emitting device. In an example and referring to FIG. 2 above, the light source is implemented as semiconductor light emitting device 210, such as a light emitting diode (LED). In another example, semiconductor light emitting device 210 is implemented as a laser diode.

At block 630, source light is generated using the light source. In one embodiment, source light is generated utilizing a semiconductor light emitting device. In an example and referring to FIGS. 2-4 above, source light is generated utilizing semiconductor light emitting device 210. In this example, semiconductor light emitting device 210 provides the source light and is mounted in a surface mountable package. In other examples, semiconductor light emitting device 210 provides the source light and is mounted in a reflector cup mounting package (not shown) or in a through-hole package (not shown).

At block 640, source light is absorbed within a layer of luminescent material having a specific and consistent thickness and a specific and consistent density of luminescent particles. In one embodiment, source light is absorbed by luminescent particles within the thin-film luminescent material layer.

The luminescent particles within the luminescent material layer are implemented as a phosphor material or a blend of two or more phosphor materials, such as a compound phosphor.

In an example and referring to FIG. 2 above, luminescent particles 235 within thin-film luminescent material layer 230 absorb all source light emitted by light emitting device 210. In this example, when all source light is absorbed thin-film luminescent material layer 230 emits a luminescent material emitted light. In another example, thin-film luminescent material layer 230 absorbs less than all of the source light. In this example, a composite light including unabsorbed source light and the luminescent material emitted light is emitted.

At block 650, the layer of luminescent material emits a light output at least in part in response to the absorbed light. In one embodiment, in response to the absorbed source light, the layer of luminescent material photoluminesces and a light output is emitted.

In an example and referring to FIG. 2 above, when source light emitted by semiconductor light emitting device 210 is fully absorbed by luminescent material within thin-film luminescent material layer 230, the light output is a luminescent material emitted light. In another example, when the luminescent material within thin-film luminescent material layer 230 absorbs less than all the source light emitted by semiconductor light emitting device 210, the emitted light is a composite light.

At optional block 660, the emitted light is absorbed within a layer of luminescent material having a specific and consistent thickness and density of luminescent particles. In one embodiment, the emitted light is absorbed by luminescent particles within a second thin-film luminescent material layer.

The luminescent particles within the luminescent material layer are implemented as a phosphor material or a blend of two or more phosphor materials, such as a compound phosphor.

In an example and referring to FIG. 3 above, luminescent particles (not shown) within second thin-film luminescent material layer 340 absorb, at least in part, the emitted light emitted by first thin-film luminescent material layer 330.

At optional block 670, the layer of luminescent material emits a light output at least in part in response to the absorbed light. In one embodiment, in response to the absorbed emitted light, the layer of luminescent material photoluminesces and a light output is emitted.

At optional block 680, the emitted light is absorbed within a layer of luminescent material having a specific and consistent thickness and density of luminescent particles. In one embodiment, the emitted light is absorbed by luminescent particles within a third thin-film luminescent material layer.

The luminescent particles within the luminescent material layer are implemented as a phosphor material or a blend of two or more phosphor materials, such as a compound phosphor.

In an example and referring to FIG. 4 above, luminescent particles (not shown) within third thin-film luminescent material layer 450 absorb, at least in part, the emitted light emitted by second thin-film luminescent material layer 340.

At optional block 690, the layer of luminescent material emits a light output at least in part in response to the absorbed light. In one embodiment, in response to the absorbed emitted light, the layer of luminescent material photoluminesces and a light output is emitted.

Method 600 then advances to block 695 where it ends.

The above-described lighting device and methods for producing a spectrally-shifted light output from a semiconductor light emitting device utilizing thin-film luminescent layers are an exemplary lighting device and methods. These lighting devices and methods illustrate a possible approach for producing a spectrally-shifted light output from a semiconductor light emitting device utilizing thin-film luminescent layers. The actual implementation may vary from the lighting device or method disclosed. Moreover, various other improvements and modifications to this invention are possible, and those improvements and modifications will fall within the scope of this invention set forth in the claims below.

The present invention may be embodied in other specific forms without departing from its essential characteristics. The described embodiments are to be considered in all respects only as illustrative and not restrictive.

I claim:

1. A lighting device, comprising:
   a semiconductor light emitting device providing a source light; and
   a first thin-film luminescent material layer coating a surface of the semiconductor light emitting device, the first thin-film luminescent material layer including a luminescent material emitting an emitted light in response to the source light, the first thin-film luminescent material layer having a specific and consistent thickness and specific and consistent density of luminescent particles;
   wherein the specific and consistent thickness of the first thin-film luminescent material layer is selected to generate composite light having a desired color;
   the lighting device further comprising a second thin-film luminescent material layer coating a surface of the first thin-film luminescent material layer, the second thin-film luminescent material layer including luminescent material emitting an emitted light in response to the emitted light from the first thin film luminescent material layer, the second thin-film luminescent material layer having a specific and consistent thickness and specific and consistent density of luminescent particles;
   wherein the specific and consistent thickness of the first thin-film luminescent material layer and the specific and consistent thickness of the second thin-film luminescent material layer are selected to generate the composite light having a desired color appearance.

2. The lighting device of claim 1, additionally comprising a package in which the light emitting device is mounted.

3. The lighting device of claim 1, wherein the package is selected from the group consisting of: a reflector cup package, a surface mountable package, and a through-hole package.

4. The lighting device of claim 1, wherein the luminescent material comprises:
   at least one phosphor.

5. A process for fabricating a lighting device, the process comprising:
   providing a semiconductor light emitting device operable to provide a source light;
   providing a first luminescent material;
   coating a surface of the semiconductor light emitting device with a thin layer of first luminescent material, the thin layer of first luminescent material having a specific and consistent thickness and specific and consistent density of luminescent particles such that said source light is partially absorbed by said first luminescent material;
   selecting the specific and consistent thickness of the thin layer of first luminescent material to generate composite light comprising a mix of the unabsorbed source light and light emitted by the first luminescent material such that the composite light has a desired color;
   providing a second luminescent material;
   coating a surface of the thin layer of first luminescent material with a thin layer of second luminescent material, the thin layer of second luminescent material having a specific and consistent thickness and specific and consistent density of luminescent particles; and
   selecting the specific and consistent thickness of the thin layer of first luminescent material and the specific and consistent thickness of the thin layer of second luminescent material to generate the composite light having a desired color.

6. The process of claim 5, wherein the luminescent material comprises:
at least one phosphor.

7. The process of claim 5, additionally comprising mounting the semiconductor light emitting device in a package.

8. The process of claim 7, wherein the package is selected from the group consisting of: a reflector cup package, a surface mountable package, and a through-hole package.

9. A method for providing a spectrally-shifted light output, the method comprising:
providing a semiconductor light emitting device, the semiconductor light emitting device including a first thin-film luminescent material layer and a second thin-film luminescent material layer coating the first thin-film luminescent material layer, the first thin-film luminescent material layer having a specific and consistent thickness and specific and consistent density of luminescent particles coating a surface of the light emitting device;
generating a source light using the semiconductor light emitting device;
absorbing at least part of the source light within the first thin-film luminescent material layer;
emitting a first emitted light from the first thin-film luminescent material layer in response to the absorbed source light;
absorbing at least part of the first emitted light within the second thin-film luminescent material layer, the second thin-film luminescent material layer having a specific and consistent thickness and density of luminescent particles; and
emitting a second emitted light from the second thin-film luminescent material layer in response to the absorbed first emitted light.

10. The method of claim 9, further comprising:
providing a semiconductor light emitting device, the semiconductor light emitting device additionally including a third thin-film luminescent layer coating the second thin-film luminescent material layer;
absorbing at least part of the second emitted light within the third thin-film luminescent material layer, the third thin-film luminescent material layer having a specific and consistent thickness and density of luminescent particles; and
emitting a third emitted light from the third thin-film luminescent material layer in response to the absorbed second emitted light.

11. A lighting device, comprising:
a semiconductor light emitting device providing a source light;
a first thin-film luminescent material layer coating a surface of the semiconductor light emitting device, the first thin-film luminescent material layer including a luminescent material emitting an emitted light in response to the source light, the first thin-film luminescent material layer having a specific and consistent thickness and specific and consistent density of luminescent particles; and
a second thin-film luminescent material layer coating a surface of the first thin-film luminescent material layer, the second thin-film luminescent material layer including luminescent material emitting an emitted light in response to the emitted light from the first thin film luminescent material layer, the second thin-film luminescent material layer having a specific and consistent thickness and specific and consistent density of luminescent particles;
wherein the specific and consistent thickness of the first thin-film luminescent material layer is selected to generate composite light having a desired color.

12. The lighting device of claim 11, further comprising:
a third thin-film luminescent material layer coating a surface of the second thin-film luminescent material layer, the third thin-film luminescent material layer including a luminescent material emitting an emitted light in response to the emitted light emitted from the second thin-film luminescent material layer, the third thin-film luminescent material layer having a specific and consistent thickness and specific and consistent density of luminescent particles.

13. A process for fabricating a lighting device, the process comprising:
providing a semiconductor light emitting device operable to provide a source light;
providing a first luminescent material;
coating a surface of the semiconductor light emitting device with a thin layer of first luminescent material, the thin layer of first luminescent material having a specific and consistent thickness and specific and consistent density of luminescent particles;
selecting the specific and consistent thickness of the thin layer of first luminescent material to generate composite light having a desired color;
providing a second luminescent material; and
coating a surface of the thin layer of first luminescent material with a thin layer of second luminescent material, the thin layer of second luminescent material having a specific and consistent thickness and specific and consistent density of luminescent particles.

14. The process of claim 13, further comprising:
providing a third luminescent material;
coating a surface of the thin layer of second luminescent material with a thin layer of third luminescent material, the thin layer of third luminescent material having a specific and consistent thickness and specific and consistent density of luminescent particles.

15. A method for providing a spectrally-shifted light output, the method comprising:
providing a semiconductor light emitting device, the semiconductor light emitting device including a first thin-film luminescent material layer, the first thin-film luminescent material layer having a specific and consistent thickness and specific and consistent density of luminescent particles coating a surface of the light emitting device, the semiconductor light emitting device additionally including a second thin-film luminescent material layer coating the first thin-film luminescent material layer;
generating a source light using the semiconductor light emitting device;
absorbing at least part of the source light within the first thin-film luminescent material layer;
emitting a first emitted light from the first thin-film luminescent material layer in response to the absorbed source light;
absorbing at least part of the first emitted light within the second thin-film luminescent material layer, the second thin-film luminescent material layer having a specific and consistent thickness and density of luminescent particles; and
emitting a second emitted light from the second thin-film luminescent material layer in response to the absorbed first emitted light;

wherein the specific and consistent thickness of the first thin-film luminescent material layer is selected to generate composite light having a desired color.

16. The method of claim 15, further comprising:

providing a semiconductor light emitting device, the semiconductor light emitting device additionally including a third thin-film luminescent layer coating the second thin-film luminescent material layer;

absorbing at least part of the second emitted light within the third thin-film luminescent material layer, the third thin-film luminescent material layer having a specific and consistent thickness and density of luminescent particles; and emitting a third emitted light from the third thin-film luminescent material layer in response to the absorbed second emitted light.

17. A method for providing a spectrally-shifted light output, the method comprising:

providing a semiconductor light emitting device, the semiconductor light emitting device including a first thin-film luminescent material layer, the first thin-film luminescent material layer having a specific and consistent thickness and specific and consistent density of luminescent particles coating a surface of the light emitting device, the semiconductor light emitting device additionally including a second thin-film luminescent material layer coating the first thin-film luminescent material layer;

generating a source light using the semiconductor light emitting device;

absorbing at least part of the source light within the first thin-film luminescent material layer;

emitting a first emitted light from the first thin-film luminescent material layer in response to the absorbed source light;

absorbing at least part of the first emitted light within the second thin-film luminescent material layer, the second thin-film luminescent material layer having a specific and consistent thickness and density of luminescent particles; and emitting a second emitted light from the second thin-film luminescent material layer in response to the absorbed first emitted light;

wherein the specific and consistent thickness of the first thin-film luminescent material layer and the specific and consistent thickness of the second thin-film luminescent material layer are selected to generate the composite light having a desired color.

* * * * *